(12) United States Patent
Weberg

(10) Patent No.: US 11,990,925 B2
(45) Date of Patent: May 21, 2024

(54) RADIO FRONT-END

(71) Applicant: Nordic Semiconductor ASA, Trondheim (NO)

(72) Inventor: Stein Erik Weberg, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 100 days.

(21) Appl. No.: 17/944,868

(22) Filed: Sep. 14, 2022

(65) Prior Publication Data

US 2023/0098175 A1 Mar. 30, 2023

(30) Foreign Application Priority Data

Sep. 20, 2021 (GB) .................................... 2113387

(51) Int. Cl.
*H04B 1/04* (2006.01)
*H03L 7/099* (2006.01)
(Continued)

(52) U.S. Cl.
CPC .............. *H04B 1/04* (2013.01); *H03L 7/099* (2013.01); *H04B 1/1607* (2013.01); *H04B 1/18* (2013.01);
(Continued)

(58) Field of Classification Search
None
See application file for complete search history.

(56) References Cited

U.S. PATENT DOCUMENTS

| 6,026,286 A * | 2/2000 | Long ........................ H04B 1/28 455/341 |
| 7,209,727 B2 * | 4/2007 | Castaneda .............. H04B 1/581 455/341 |

(Continued)

FOREIGN PATENT DOCUMENTS

| CN | 105099414 A | * 11/2015 | ............... H04B 1/44 |
| CN | 113630147 A | * 11/2021 | |
| CN | 116569479 A | * 8/2023 | ............. H01L 23/60 |

OTHER PUBLICATIONS

IPO Search Report under Section 17 for GB2113387.1, dated Mar. 4, 2022, 4 pages.
(Continued)

*Primary Examiner* — Pablo N Tran
(74) *Attorney, Agent, or Firm* — Klarquist Sparkman, LLP

(57) ABSTRACT

A circuit portion for a radio transceiver comprises: a power amplifier for use when the transceiver operates in a transmission mode, a low-noise amplifier for use when the transceiver operates in a reception mode, a voltage control circuit portion, and a transformer. The transformer comprises a primary winding with a terminal for connecting to an antenna, and a secondary winding comprising a first terminal, a second terminal and a third terminal located between the first and second terminals. The power amplifier is connected to the secondary winding, the low-noise amplifier is connected to both the primary and secondary windings and the voltage control circuit portion is connected to the third terminal of the secondary winding. The voltage control circuit portion applies a first voltage to the third terminal when the transceiver operates in the transmission mode and applies a second, different voltage when the transceiver operates in the reception mode.

20 Claims, 3 Drawing Sheets

(51) Int. Cl.
*H04B 1/16* (2006.01)
*H04B 1/18* (2006.01)
*H04B 1/38* (2015.01)

(52) U.S. Cl.
CPC ....... *H04B 1/38* (2013.01); *H04B 2001/0408* (2013.01)

(56) References Cited

U.S. PATENT DOCUMENTS

| | | | |
|---|---|---|---|
| 8,112,044 B2* | 2/2012 | Marholev | H04B 5/48 455/90.3 |
| 9,729,192 B2* | 8/2017 | Conta | H04B 1/525 |
| 9,780,828 B2* | 10/2017 | Afsahi | H04B 1/44 |
| 2010/0201457 A1 | 8/2010 | Lee et al. | |
| 2011/0281531 A1 | 11/2011 | Chiang et al. | |
| 2013/0267185 A1* | 10/2013 | Chen | H04B 1/44 455/78 |
| 2017/0012652 A1 | 1/2017 | Fanori et al. | |
| 2023/0194656 A1* | 6/2023 | Song | G01S 7/285 342/175 |
| 2023/0370120 A1* | 11/2023 | Lai | H04B 5/26 |

OTHER PUBLICATIONS

Li et al., "$G_m$-Boosted Common-Gate LNA and Differential Colpitts VCO/QVCO in 0.18-μm CMOS," *IEEE Journal of Solid State Circuits*, vol. 40, No. 12, Dec. 2005, pp. 2609-2619.

* cited by examiner

RADIO FRONT-END

CROSS REFERENCE TO RELATED APPLICATION

This application claims priority from Great Britain Application No. 2113387.1, filed Sep. 20, 2021, which application is incorporated herein by reference in its entirety.

FIELD

The present invention relates to radio-frequency (RF) front-end circuitry for radio transceivers.

BACKGROUND

Radio communication devices typically utilise one or more antennas in order to transmit and/or receive radio signals. In order to effectively utilise these antennas, radio transceivers typically utilise RF front-end circuitry, operable at radio frequencies, to amplify any signals received from the antenna(s) and amplify signals for transmission using the antenna(s). Devices capable of both transmission and reception usually include a receive chain and a transmit chain, with front-end circuitry acting as the first stage in the receive chain and acting as the final stage in the transmit chain.

Radio signals received at an antenna typically have very low amplitude/power, and thus it is important to amplify these signals before feeding them to later stages in the receive chain, e.g. a mixer. Front-end radio circuitry typically include low-noise amplifiers for this purpose: low-noise amplifiers are used to amplify received radio signals whilst introducing minimal additional noise in order keep the signal-to-noise ratio (SNR) of the amplified signal as close as possible to that of the signal initially received at the antenna.

Similarly, radio signals generated internally by earlier stages in the transmit chain typically have low amplitude/power, and thus it is important to amplify these internally generated signals before feeding them to an antenna for transmission. Front-end radio circuitry typically include power amplifiers for this purpose: power amplifiers are used to amplify internally generated radio signals in order to drive an antenna.

It is also common for front-end radio circuitry to include a transformer in order to improve impedance matching between the antenna and low-noise amplifiers (during reception) and power amplifiers (during transmission), thereby improving the SNR of both received and transmitted radio signals.

Advancements in radio technology have increased demand for smaller, more energy efficient, cheaper and more effective radio communication devices.

Accordingly, the Applicant has recognised a need for improved RF front-end circuitry.

SUMMARY OF THE INVENTION

When viewed from a first aspect, the invention provides a circuit portion for a radio transceiver, wherein the transceiver is configured to operate in:
 a transmission mode in which the transceiver is capable of transmitting radio signals; and
 a reception mode in which the transceiver is capable of receiving radio signals;
wherein the circuit portion comprises:
 a power amplifier for use when the transceiver is operating in the transmission mode;
 a low-noise amplifier circuit portion for use when the transceiver is operating in the reception mode;
 a voltage control circuit portion; and
 a transformer comprising:
  a primary winding comprising a first terminal for connecting to an antenna; and
  a secondary winding comprising a first terminal, a second terminal and third terminal, the third terminal being located between the first and second terminals;
wherein:
 the power amplifier is connected to the secondary winding;
 the low-noise amplifier circuit portion is connected to both the primary winding and to the secondary winding; and
 the voltage control circuit portion is connected to the third terminal of the secondary winding, the voltage control circuit portion being arranged to:
  apply a first voltage to the third terminal of the secondary winding when the transceiver is operating in the transmission mode; and
  apply a second voltage to the third terminal of the secondary winding when the transceiver is operating in the reception mode, the second voltage being different from the first voltage.

When viewed from a second aspect, the invention provides a method of operating a radio transceiver, the transceiver comprising:
 a power amplifier;
 a low-noise amplifier circuit portion;
 a voltage control circuit portion; and
 a transformer comprising:
  a primary winding comprising a first terminal for connecting to an antenna; and
  a secondary winding comprising a first terminal, a second terminal and third terminal, the third terminal being located between the first and second terminals;
wherein:
 the power amplifier is connected to the secondary winding;
 the low-noise amplifier circuit portion is connected to both the primary winding and to the secondary winding; and
 the voltage control circuit portion is connected to the third terminal of the secondary winding;
the method comprising:
 transmitting one or more radio signals while operating the transceiver in a transmission mode;
 receiving one or more radio signals while operating the transceiver in a reception mode;
 applying a first voltage to the third terminal of the secondary winding using the voltage control circuit portion when the transceiver is operating in the transmission mode; and
 applying a second voltage to the third terminal of the secondary winding using the voltage control circuit portion when the transceiver is operating in the reception mode, the second voltage being different from the first voltage.

Thus it will be seen that, in accordance with the present invention, a single transformer may be shared by both a power amplifier for transmission and a low-noise amplifier for reception, and thus the present invention may provide an integrated RF front-end solution that offers performance improvements in both transmission and reception of radio signals whilst keeping power consumption and area requirements at a minimum. The same transformer may be able to be used by both the power amplifier and the low-noise amplifier due to the inclusion of the third terminal of the secondary winding and the configuration of the voltage control circuit portion enabling different voltages to be applied thereto in dependence on whether the transceiver is being used for transmission or reception. By applying these different voltages to the third terminal of the secondary winding, the circuit portion may be able to effectively enable the power amplifier and effectively disable the low-noise amplifier when the transceiver is operating in the transmission mode, and to effectively enable the low-noise amplifier and effectively disable the power amplifier when the transceiver is operating in the reception mode. In doing so, unwanted adverse effects (e.g. increased noise, DC bias, etc.) from the low-noise amplifier during transmission may be mitigated, and similarly unwanted adverse effects from the power amplifier during reception may be mitigated.

Furthermore, it will be seen that, in accordance with the present invention, the low-noise amplifier circuit portion is connected across the two windings of the transformer, rather than being simply connected to e.g. two terminals of the secondary winding. As will be described in further detail below, this may help maximising signal swing across the low-noise amplifier circuit portion and thus enable the low-noise amplifier circuit portion to amplify received signals with greater gain without generating significant additional noise.

Thus it will be seen that the circuit portion may be particularly useful for half-duplex applications: the circuit portion can be effectively used either for transmission or reception at any given moment, but not both. By connecting the voltage control circuit portion to the third terminal, located between the first and second terminals of the secondary winding, the voltage control circuit portion may be able to configure the circuit portion for both transmission (by applying the first voltage thereto) and reception (by applying the second voltage thereto) whilst using minimal connections—i.e. a single connection between the voltage control circuit portion and the secondary winding of the transformer—thereby reducing the bill-of-materials and physical space required for the circuit portion.

The inclusion of a transformer may enable improved impedance-matching between an antenna and the power and low-noise amplifiers, thus enabling increased power transfer between the power amplifier and the antenna during transmission and between the antenna and the low-noise amplifier during reception. This may help improve the effectiveness and range of radio transceivers including the circuit portion due to higher transmission power and greater ability to receive low-power signals. It may also help reduce overall power consumption as the amount of power required to amplify signals for effective transmission, and to amplify signals received from an antenna, may be reduced.

The term "connected" is used herein to describe that two or more components or terminals are electrically connected either directly (e.g. via a wire) or through one or more further electronic components (e.g. resistors, capacitors, inductors, transistors, etc.), which may be connected in series or in parallel. The term "connected" may be used interchangeably with the term "coupled" throughout this disclosure.

In a set of embodiments, the first voltage provides a bias voltage to the power amplifier, and increases a voltage at a connection between the low-noise amplifier circuit portion and the secondary winding such that negligible current flows from the low-noise amplifier to the secondary winding; and the second voltage provides negligible bias voltage to the power amplifier, and decreases the voltage at the connection between the low-noise amplifier circuit portion and the secondary winding such that current may flow from the low-noise amplifier circuit portion to the secondary winding.

Thus, it will be seen that in such embodiments the first voltage applied to the third terminal of the secondary winding during the transmission mode effectively enables the power amplifier by applying a bias voltage to outputs thereof, and effectively disables the low-noise amplifier circuit portion by increasing the voltage at the connection between the low-noise amplifier circuit portion and the secondary winding. As a result, the low-noise amplifier circuit portion may be prevented from adversely affecting signals output by the power amplifier during transmission, particularly by preventing DC current passing through the low-noise amplifier circuit portion to the secondary winding of the transformer. Similarly, it will be seen that the second voltage applied to the third terminal of the secondary during the reception mode effectively enables the low-noise amplifier circuit portion by decreasing the voltage at the connection between the low-noise amplifier circuit portion and the secondary winding, and effectively disables the power amplifier by providing no or negligible bias voltage to outputs thereof. As a result, the power amplifier may be prevented from adversely affecting any signals received from an antenna.

In a set of embodiments, the low-noise amplifier circuit portion comprises a low-noise amplifier (LNA) transistor having a gate terminal connected to the first terminal of the primary winding and a source terminal connected to the first terminal of the secondary winding. Thus in such embodiments it will be seen that the gate terminal of the LNA transistor is connected to the same terminal of the primary winding as an antenna would be, and so the gate terminal receives a signal (or a version thereof) via a connection to an antenna rather than through the transformer. The source terminal of the LNA transistor, on the other hand, is connected to the secondary winding. Thus, when a signal is received at a connected antenna, due to the nature of signal transmission from the primary winding to the secondary winding of the transformer, the signal received at the source terminal of the LNA transistor is in antiphase relative to the signal received at the gate terminal of the LNA transistor.

In such embodiments, the first voltage may cause negligible current to flow from the low-noise amplifier circuit portion to the secondary winding by reducing a gate-source voltage of the LNA transistor such that negligible current flows between a drain terminal and the source terminal thereof, thereby effectively disabling the low-noise amplifier circuit portion when the transceiver during transmission. Also, in such embodiments, the second voltage may allow current to flow from the low-noise amplifier circuit portion to the secondary winding by increasing the gate-source voltage of the LNA transistor such that current may flow between the drain terminal and the source terminal thereof, thereby effectively enabling the low-noise amplifier circuit portion during reception.

In a set of embodiments, the circuit portion is arranged such that when a first signal is received at the gate terminal of the low-noise amplifier transistor, a second signal is received at the source terminal of the low-noise amplifier transistor that is in antiphase relative to the first signal. This may result in an increased magnitude of the voltage swing across the gate and source terminals of the LNA transistor (i.e. the gate-source voltage swing of the LNA transistor) when a radio signal is received. This may have the advantage of increasing the amplitude of an output of the low-noise amplifier circuit portion relative to the amplitude of a signal received from a connected antenna—i.e. increasing the overall gain of the low-noise amplifier circuit portion. Consequently, this may also increase the SNR of the output of the low-noise amplifier circuit portion.

In a set of embodiments, the low-noise amplifier circuit portion further comprises a capacitor connected in series between the first terminal of the primary winding and the gate terminal of the low-noise amplifier transistor. The capacitor may act as a high-pass filter whereby DC components of a received signal are filtered out and only AC components of the received signal are fed to the gate terminal of the LNA transistor. As well as improving the quality of the signal received at the gate terminal of the LNA transistor, thus reducing noise, the inclusion of the capacitor may help reduce strain on the gate terminal of the LNA transistor and thus increase its longevity by reducing the chance of the gate terminal being damaged.

In a set of embodiments, the low-noise amplifier circuit portion further comprises an electrostatic discharge (ESD) protection module connected in series with the gate terminal of the LNA transistor. The ESD protection module may be arranged to protect the gate terminal of the low-noise amplifier transistor from ESD without attenuating the critical signal received from an antenna. It will be appreciated that the ESD protection module may comprise any appropriate arrangement of components (e.g. transistors, diodes, etc.) that provide suitable ESD protection without attenuating the critical signal received from an antenna. By providing an ESD protection module between the capacitor and the gate terminal of the LNA transistor in this manner, the longevity of the circuit portion may be increased by reducing the chance of said gate terminal being damaged due to ESD.

In a set of embodiments, the low-noise amplifier circuit portion further comprises a biasing circuit portion comprising a diode-connected mirror transistor and a resistor, wherein:
  a gate terminal of the mirror transistor is connected to the gate terminal of the low-noise amplifier transistor;
  a source terminal of the mirror transistor is connected to the source terminal of the low-noise amplifier transistor; and
  the resistor is connected in series between the gate terminal of the mirror transistor and the gate terminal of the low-noise amplifier transistor.

In a set of embodiments, the biasing circuit portion is arranged to provide a bias voltage to the gate terminal of the low-noise amplifier transistor. Such a biasing circuit portion may effectively form a current mirror arrangement, with the source terminals of the mirror transistor and the LNA transistor both being connected at the same location (the first terminal of the secondary winding). This may enable the biasing circuit portion to provide a substantially constant bias voltage to the gate terminal of the LNA transistor, and for that bias voltage to remain substantially constant despite voltage variations from signals received from an antenna. As used herein, the term "diode-connected" is used to describe that a gate terminal of a transistor is connected to its drain terminal.

In a set of embodiments, the low-noise amplifier circuit portion further comprises:
  a cascode transistor; and
  a load circuit portion comprising an inductor and a capacitor connected in parallel;
wherein:
  a source terminal of the cascode transistor is connected to the drain terminal of the low-noise amplifier transistor; and
  a drain terminal of the cascode transistor is connected to the load circuit portion.

The load circuit portion may be further connected to a supply voltage. Thus it will be seen that the cascode transistor and LNA transistor may form a cascode arrangement in which the cascode transistor effectively isolates the LNA transistor from the load circuit portion (and therefore from the supply voltage). This may have the distinct advantage of preventing a local oscillator (LO) component from a mixer included in a receive chain of the transceiver from travelling back through the low-noise amplifier circuit portion and eventually radiating from a connected antenna—i.e. it may improve reverse isolation for the LNA transistor and thus the low-noise amplifier circuit portion as a whole. Furthermore, this may reduce a Miller effect for the LNA transistor and thus reduce its input capacitance. Additionally, this may increase the output impedance of the low-noise amplifier circuit portion, thus enabling improved impedance matching between the output thereof and further circuitry included in a receive chain of the transceiver (e.g. a mixer) and increasing the overall gain of the low-noise amplifier circuit portion.

The cascode transistor may be connected to further control circuitry configured to ground a gate terminal thereof in order to prevent current from flowing from the drain terminal to the source terminal thereof. This may help further prevent the low-noise amplifier circuit portion adversely affecting signals output by the power amplifier during transmission, particularly by further preventing DC current passing through the low-noise amplifier circuit portion to the secondary winding of the transformer.

The load circuit portion may provide a load from which the LNA transistor, and thus the low-noise amplifier circuit portion as a whole, may draw current when the transceiver is operating in the reception mode. The current drawn from the load circuit portion may be proportional to a voltage signal received from the antenna. Thus, the voltage at the drain terminal of the cascode transistor may be proportional to the current drawn by the low-noise amplifier circuit portion (particularly the LNA transistor), and thus comprise an amplified version of a voltage signal received from a connected antenna during reception. This amplified voltage signal may then serve as an output of the low-noise amplifier circuit portion and be fed to further circuitry included in a receive chain of the transceiver for further processing.

The load circuit portion may further comprise a resistor connected in parallel with the inductor and the capacitor. By including an inductor, capacitor, and potentially a resistor (i.e. a RLC circuit) in the load circuit portion in this manner, the output impedance of the low-noise amplifier circuit portion may be increased. This may enable improved impedance matching between the low-noise amplifier circuit portion and further circuitry included in a receive chain of the transceiver (e.g. a mixer), as well as increase gain at the output of the low-noise amplifier circuit portion. Specifically, the inclusion of the inductor in parallel with the capacitor (and, in some embodiments, with a capacitor included at the input of a connected mixer), may cause the load circuit portion to resonate at frequencies close to that of a typical signal received at an antenna. At resonance, the capacitors and inductor may not be 'visible' from the perspective of the low-noise amplifier circuit portion, and thus not affect the signal output by the low-noise amplifier circuit portion. Thus the resistor (or, in embodiments where no resistor is included, the quality factor of the inductor at resonance) may determine the output impedance, and therefore the gain, of the low-noise amplifier circuit portion.

In a set of embodiments, the power amplifier is a differential power amplifier comprising a first output and a second output;

the first terminal of the secondary winding is connected to the first output terminal of the power amplifier; and the second terminal of the secondary winding is connected to the second output terminal of the power amplifier.

In such embodiments, when the transceiver is operating in the transmission mode, the power amplifier generates a first voltage signal at its first output terminal and a second voltage signal at its second output terminal, with the second voltage signal typically having an equal and opposite amplitude relative to the first voltage signal (i.e. the first and second voltage signals being in antiphase with equal amplitude). Thus, in such embodiments, the signal for transmission may comprise the difference between the first and second voltage signals, and thus the two output terminals may comprise differential output terminals.

In a set of embodiments, the third terminal of the secondary winding is located at a midpoint between the first and second terminals of the secondary winding. This may have the distinct advantage of enabling the third terminal to act as a virtual ground—i.e. be maintained at a substantially constant reference voltage—whilst the power amplifier is outputting signals during transmission. This is particularly the case when the power amplifier is a differential power amplifier, as the third terminal is located at the midpoint between the two differential outputs of the power amplifier (and therefore the differential signals output by the power amplifier can be considered to "cancel out" at the third terminal). By having the third terminal be located at the midpoint between the first and second terminal of the secondary winding, and therefore act as a virtual ground, the voltage control circuit portion may not receive any AC signals, and thus a capacitive load thereof may be of little or no concern. Thus, the signals output by the power amplifier may not be adversely affected by the presence of the voltage control circuit portion and particularly any transistors included therein, particularly due to any capacitive load they exhibit (e.g. by causing voltage changes to lag behind current changes within the secondary winding of the transformer).

The midpoint location of the third terminal between the first and secondary terminals of the secondary winding may therefore enable the voltage control circuit portion to be connected to a single terminal on the secondary winding whilst still being able to apply appropriate voltages thereto when the transceiver is operating in the transmission mode (i.e. the first voltage) and when the transceiver is operating in the transmission mode (i.e. the second voltage), without the voltage control circuit portion adversely affecting any transmitted or received signals.

Thus, in a set of embodiments, the third terminal of the secondary winding is arranged to act as a virtual ground when the transceiver is operating in the transmission mode.

In a set of embodiments, the voltage control circuit portion is arranged to:

apply a reference voltage to the third terminal of the secondary winding when the transceiver is operating in the transmission mode; and connect the third terminal of the secondary winding to ground when the transceiver is operating in the reception mode.

The reference voltage applied to the third terminal during transmission may provide a bias voltage to the outputs of the power amplifier (effectively enabling the power amplifier) and reduce the gate-source voltage of the LNA transistor such that negligible current flows therethough (effectively disabling the low-noise amplifier circuit portion). Connecting the third terminal to ground during reception may increase the gate-source voltage of the LNA transistor such that current may flow therethrough (effectively enabling the low-noise amplifier circuit portion) and provide no or negligible bias voltage to the outputs of the power amplifier (effectively disabling the power amplifier). Thus, as described previously, in such arrangements the low-noise amplifier may be prevented from adversely affecting signals generated by the power amplifier during transmission, and the power amplifier may be prevented from adversely affecting signals received from an antenna during reception. In some embodiments, the power amplifier and the low-noise amplifier circuit portion may be connected to further control circuitry configured to enable/disable the respective amplifiers when the transceiver is operating in the transmission mode/reception mode respectively.

Furthermore, when the transceiver is operating in the reception mode and therefore the third terminal of the secondary winding is connected to ground, the source terminal of the mirror transistor included in the biasing circuit portion may be connected to ground at the same location as the source terminal of the LNA transistor (i.e. at the third terminal of the secondary winding). This may help further enable the biasing circuit portion to provide a substantially constant bias voltage to the gate terminal of the LNA transistor.

In a set of embodiments, the primary winding comprises a second terminal that is connected to ground. This may cause voltage signals received from an antenna during reception to propagate through the primary winding of the transformer to the grounded second terminal. This may also enable voltage signals generated by the power amplifier and fed to the secondary winding of the transformer to induce voltage signals within the primary winding, and for those induced voltage signals to then be fed to a connected antenna.

In a set of embodiments, the low-noise amplifier circuit portion comprises a single-ended low-noise amplifier. This may have the distinct advantage of negating the need for a conversion between a single-ended voltage signal from e.g. a single antenna to a differential signal. This may mean that fewer components are required for the circuit portion, thus reducing the bill-of-materials and physical space required.

In a set of embodiments, the voltage control circuit portion comprises a first voltage control transistor, wherein:

a drain terminal of the first voltage control transistor is connected to the third terminal of the secondary winding; and a source terminal of the first voltage control transistor is connected to ground.

In a set of embodiments, the voltage control circuit portion comprises a second voltage control transistor, wherein:

a drain terminal of the second voltage control transistor is connected to a positive supply voltage; and a source terminal of the second voltage control transistor is connected to the third terminal of the secondary winding.

Thus it will be seen that the two voltage control transistors may be used to control the voltage applied to the third terminal of the secondary winding. The third terminal of the secondary winding, the drain terminal of the first voltage control transistor and the source terminal of the second voltage control transistor may also be connected to ground via a capacitor that acts as a high-pass filter thereby helping eliminate variations in the supply voltage. When the first voltage control transistor is enabled (i.e. its gate voltage set above a threshold) and the second voltage control transistor is disabled (i.e. its gate voltage grounded), the third terminal of the secondary voltage may be connected to ground with the second voltage control transistor providing the necessary voltage drop between the supply voltage and the grounded third terminal. When the first voltage control transistor is disabled (i.e. its gate voltage grounded) and the second voltage control transistor is enabled (i.e. its gate voltage set above a threshold, the third terminal of the secondary voltage may be connected to the supply voltage with the first voltage control transistor providing the necessary voltage drop between the supply voltage and ground. The gate voltages of the two voltage control transistors may be connected to (and therefore controlled by) further control circuitry included in the transceiver. The inclusion of the second voltage control transistor may help prevent a DC current being drawn from the supply voltage to the third terminal of the secondary winding when the transceiver is operating in the reception mode, particularly when compared to e.g. a resistor.

The terms "circuit", "circuitry" and "circuit portion" as used herein may refer to open circuits or to closed circuits; i.e. they encompass circuit portions that may form part of a closed circuit when connected to other elements such as a power supply.

Features of any aspect or embodiment described herein may, wherever appropriate, be applied to any other aspect or embodiment described herein. Features described herein in relation to a method may equally be applied to an apparatus, and vice versa. Where reference is made to different embodiments or sets of embodiments, it should be understood that these are not necessarily distinct but may overlap.

BRIEF DESCRIPTION OF THE DRAWINGS

One or more non-limiting examples will now be described, by way of example only, with reference to the accompanying figures in which.

DETAILED DESCRIPTION OF THE DRAWINGS

Figure 1:
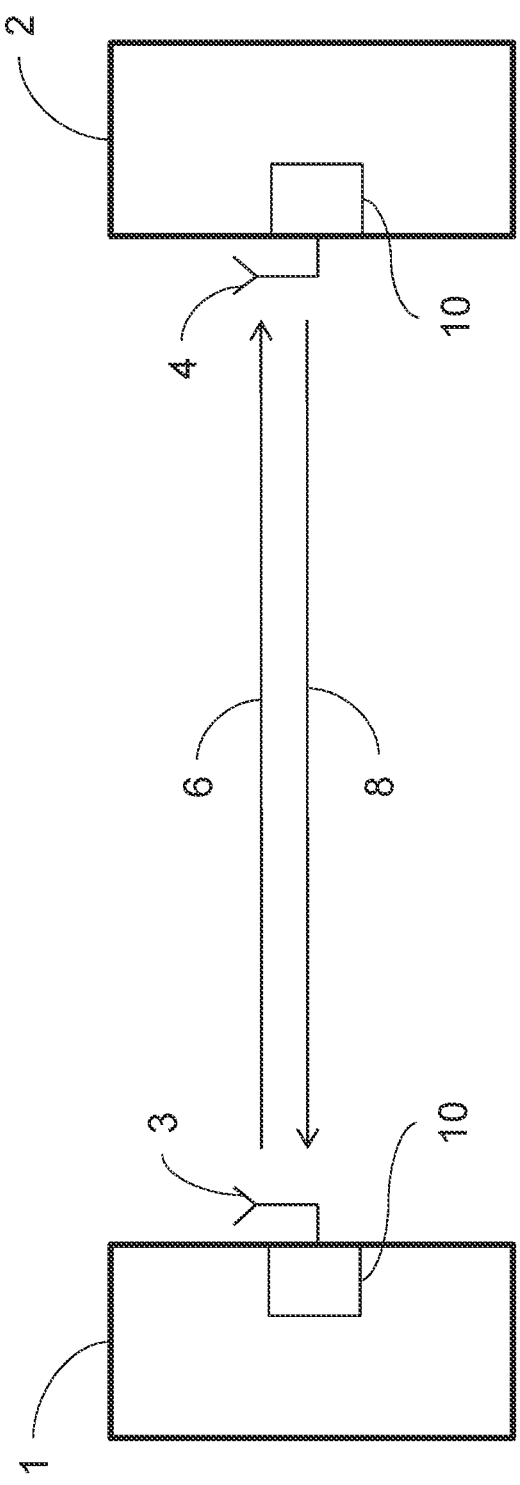
FIG. 1 shows a schematic diagram of a radio communication system including two radio transceivers each including a radio-frequency front-end circuit portion in accordance with the present invention.

FIG. 1 shows a radio system comprising a first radio transceiver device 1 and a second radio transceiver device 2. The first transceiver 1 comprises an antenna 3; and the second transceiver 2 comprises an antenna 4. As will be well understood by those skilled in the art, a number of standard modules such as processors, oscillators, filters, mixers, digital to analogue converters (DACs) and analogue to digital converters (ADCs) are provided in the radio transceivers 1 and 2 but the description of these are omitted for the sake of brevity. While the transceivers 1, 2 are each shown in FIG. 1 with a single respective antenna 3 or 4, it will be understood by those skilled in the art that the transceivers 1, 2 may comprise any number of antennas, e.g. to support operating using MIMO (multiple input, multiple output) transmission modes and/or beamforming. The transceivers 1, 2 may be any devices capable of radio communications, e.g. Bluetooth™ Low-Energy (BLE) transceivers (which may be suitable for Internet-of-Things applications), Wi-Fi transceivers, mobile communications devices, etc.

The transceivers 1, 2 are each operable in a transmission mode in which they are capable of transmitting radio signals, and a reception mode in which they are capable of receiving radio signals. It will be appreciated, however, that when the transceivers 1, 2 are in communication, one of the transceivers 1, 2 will operate in the transmission mode while the other transceiver 1, 2 will operate in the reception mode. A first signal path 6 illustrates one or more radio signals that are transmitted by the first transceiver 1 through its antenna 3 when it is operating in the transmission mode and received by the second transceiver 2 through its antenna 4 when it is operating in the reception mode. Similarly, a second signal path 8 illustrates one or more radio signals that are transmitted by the second transceiver through its antenna 4 when it is operating in the transmission mode and received by the first transceiver 1 through its antenna 3 when it is operating in the reception mode.

The antennas 3, 4 in this embodiment each comprise antenna pads integrated into a printed circuit board (PCB) included within the transceivers 1, 2 respectively, with the antennas 3, 4 including integrated electrostatic discharge (ESD) protection. It will be appreciated, however, that any appropriate type of antenna may be used for the antennas 3, 4, with or without ESD protection present.

The first and second transceivers 1, 2 each comprise exemplary radio-frequency front-end circuit portions 10 in accordance with the present invention connected to their respective antennas 3, 4.

Figure 2:
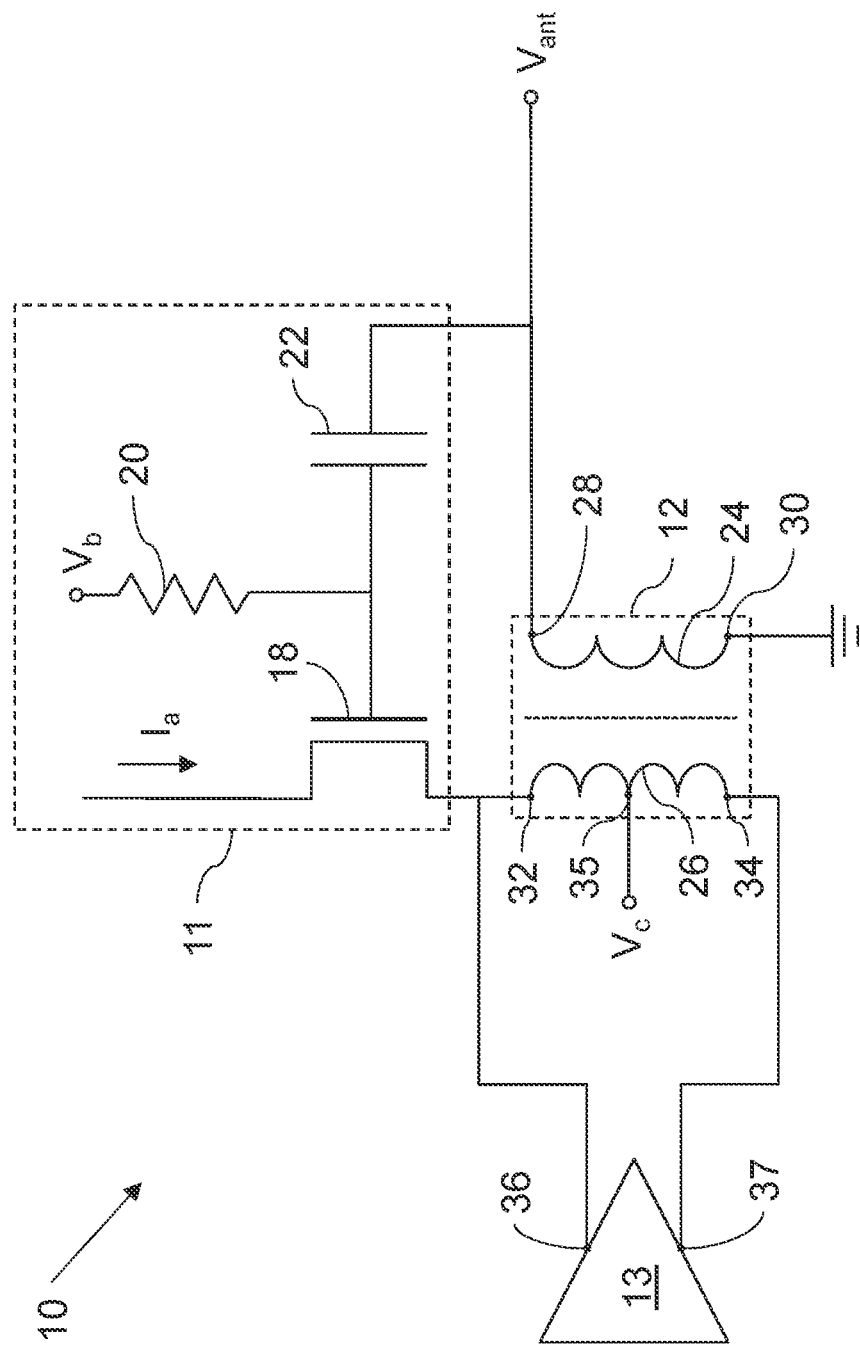
FIG. 2 shows a simplified schematic diagram of a radio-frequency front-end circuit portion in accordance with an embodiment of the present invention.

FIG. 2 is a schematic diagram of a simplified version of the circuit portion 10. The circuit portion 10 comprises a low-noise amplifier circuit portion 11, a transformer 12, and a power amplifier 13. The low-noise amplifier circuit portion 11 is for use when the transceiver 1, 2 is operating in the reception mode, and the power amplifier 13 is for use when the transceiver 1, 2 is operating in the transmission mode.

Figure 3:
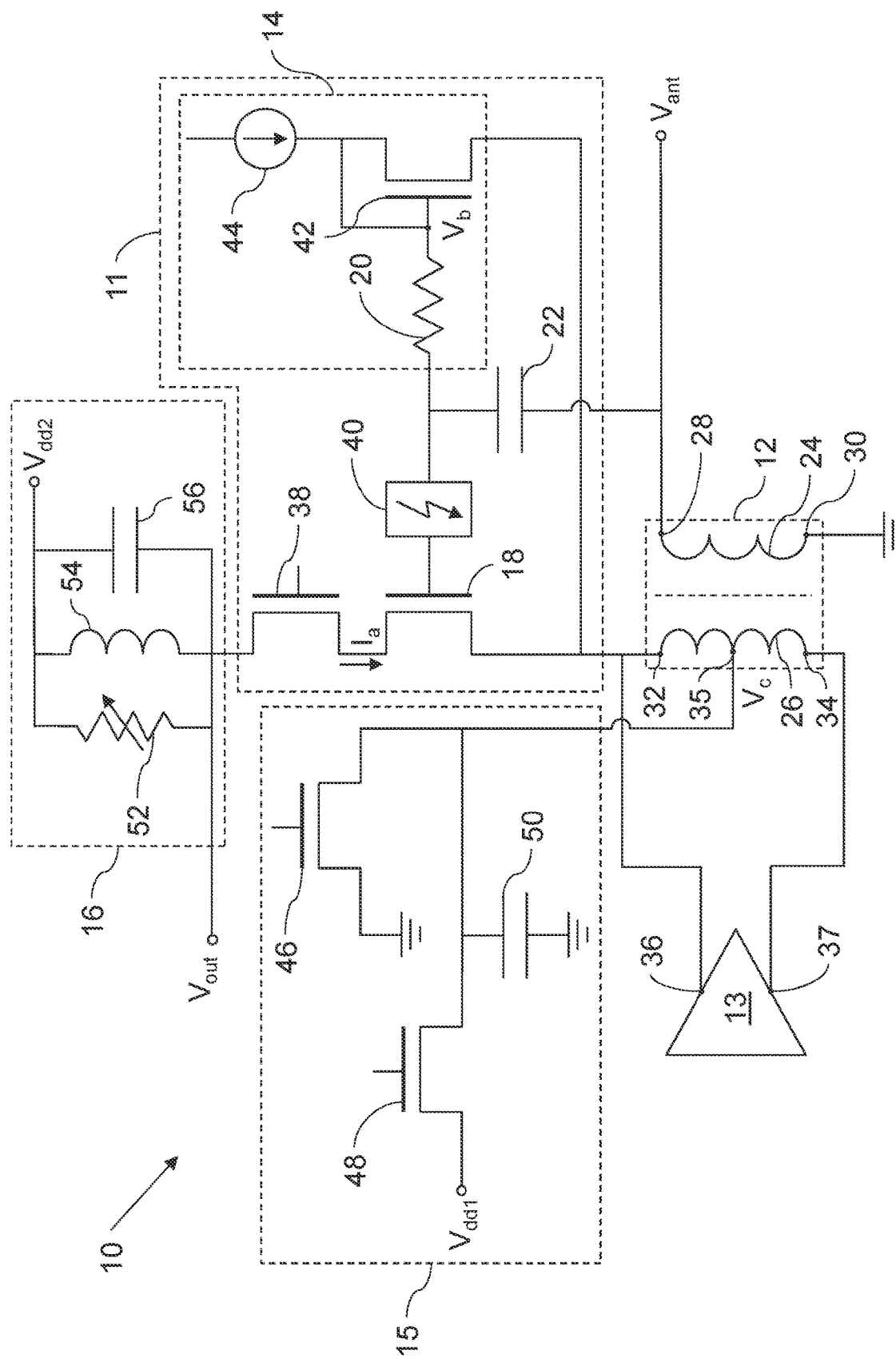
FIG. 3 shows a more detailed schematic diagram of a radio-frequency front-end circuit portion in accordance with an embodiment of the present invention.

The low-noise amplifier circuit portion 11 in this example is a single-ended low-noise amplifier comprising a low-noise amplifier (LNA) transistor 18, a bias resistor 20, and a capacitor 22. The bias resistor 20 is connected to a bias voltage $V_b$, and the low-noise amplifier transistor 18 draws a current $I_a$. The bias voltage $V_b$ is generated by further circuitry not shown in FIG. 2 for the sake of simplicity, and the current $I_a$ is drawn from further circuitry not shown in FIG. 2 for the sake of simplicity. The further circuitry used to generate $V_b$ and from which $I_a$ is drawn are shown in FIG. 3.

The transformer 12 comprises a primary winding 24 and a secondary winding 26. The transformer 12 may be integrated as part of e.g. a system-on-chip (SoC), or it may comprise its own distinct component(s) which may be connected or attached to e.g. a printed circuit board (PCB). The primary winding 24 comprises a first terminal 28 at a first end thereof and a second terminal 30 at a second end thereof. The secondary winding 26 comprises a first terminal 32 at a first end thereof, a second terminal 34 at a second end thereof, and a third terminal 35 between the first and second terminals 32, 34. In this example, the third terminal 35 is located at the midpoint (i.e. at a point half-way along the length of wire used for the secondary winding 26) between the first terminal 32 and the second terminal 34 of the secondary winding 26. However, it will be appreciated that the third terminal 35 may instead be located at a different location between the first and second terminals 32, 34 of the secondary winding 26 which is not at the midpoint.

The power amplifier 13 in this example is a differential power amplifier with a first output terminal 36 and a second output terminal 37. The power amplifier 13 may comprise a number of standard components e.g. transistors as is well known in the art, but the description of these is omitted for the sake of brevity.

The first terminal 28 of the primary winding 24 is connected to the antenna 3, 4 of the respective transceiver 1, 2, and thus transmits/receives a voltage signal $V_{ant}$ thereto/therefrom in dependence on whether the transceiver 1, 2 is operating in the transmission mode or reception mode. The second terminal 30 of the primary winding 24 is connected to ground. The capacitor 22 of the low-noise amplifier circuit portion 11 is also connected to the first terminal 28 of the primary winding 24, and thus also receives the voltage signal $V_{ant}$ from the antenna 3, 4 when the respective transceiver 1, 2 is operating in the reception mode. The capacitor 22 is then further connected to the gate terminal of the LNA transistor 18. The bias resistor 20 is also connected to the gate terminal of the LNA transistor 18.

As described previously, the drain terminal of the LNA transistor 18 is connected to further circuitry not shown in FIG. 2 from which it draws a current $I_a$. This current $I_a$ is used to generate the signal output by the low-noise amplifier circuit portion 11 to further components of the transceiver 1, 2—e.g. a mixer (not shown). The source terminal of the LNA transistor 18 is thus connected to the first terminal 32 of the secondary winding 26. Thus it will be seen that the LNA transistor 18 is effectively connected across the transformer 12, with the gate terminal thereof being connected to the primary winding 24 (via the capacitor 22) and the source terminal thereof being connected to the secondary winding 26.

The first output terminal 36 of the power amplifier 13 is connected to the first terminal 32 of the secondary winding 26 and therefore also to the source terminal of the LNA transistor 18. The second output terminal 37 of the power amplifier 13 is connected to the second terminal 34 of the secondary winding 26. The third terminal 35 of the secondary winding 26 is coupled to further circuitry (not shown in FIG. 2 for the sake of simplicity) which applies a centertap voltage $V_c$ thereto. The centertap voltage $V_c$ is a reference voltage that is configurable in dependence on the operational mode of the transceiver 1, 2, as will be described in further detail below.

The operation of the circuit portion 10 will now be described in detail. When the transceiver 1, 2 is operating in the transmission mode, the centertap voltage $V_c$ is set to a substantially constant reference voltage. In this embodiment, the centertap voltage $V_c$ is set equal to the reference voltage by connecting the third terminal 35 of the secondary winding 26 to a first substantially constant supply/reference voltage $V_{dd1}$ generated elsewhere in the transceiver 1, 2. The first supply voltage $V_{dd1}$ in this embodiment comprises a local supply voltage, connected to a global supply voltage via one or more switches or transistors, and may be equal to 1.3V, 3V, 5V, or any other appropriate voltage.

When the centertap voltage $V_c$ is set equal to $V_{dd1}$, the gate-source voltage of the LNA transistor 18 is reduced (as the bias voltage $V_b$ supplied, via the bias resistor 20, to the gate terminal of the LNA transistor 18, remains substantially constant). As a result, the LNA transistor 18 is effectively disabled, as the reduced gate-source voltage thereof effectively prevents current from flowing from the drain terminal to the source terminal thereof, and thus the current drawn by the LNA transistor 18 becomes effectively negligible. Setting the centertap voltage $V_c$ equal to $V_{dd1}$ in this manner effectively disables the low-noise amplifier circuit portion 11 when the transceiver 1, 2 is operating in the transmission mode.

When the transceiver 1, 2 transmits a radio signal, a first voltage signal is generated at the first output 36 of the power amplifier 13. At the same time, a second voltage signal is generated at the second output of the 37 of the power amplifier 13. The second voltage signal and the first voltage signal have equal and opposite amplitudes (i.e. they are in antiphase with equal amplitude), and thus the signal for transmission consists of the difference between the first and second voltage signals (hence, the power amplifier 13 in this embodiment is a differential power amplifier). These two differential voltage signals are then fed to the first and second terminals 32, 34 respectively of the secondary winding 26, thereby inducing an oscillating magnetic field in the secondary winding 26. As the third terminal 35 is located at the mid-point between the first and second terminals 32, 34 of the secondary winding 26, the voltage $V_c$ stays substantially constant, and thus the third terminal 35 acts as a virtual ground when the transceiver 1, 2 is operating in the transmission mode. Furthermore, the centertap voltage $V_c$ being set to the reference voltage $V_{dd1}$ provides a bias voltage to the two output terminals 36, 37 of the power amplifier 13 which is required for the power amplifier 13 to operate.

The oscillating magnetic field within the secondary winding 26, generated by the power amplifier 13, induces an antiphase oscillating magnetic field within the primary winding 24. This in turn induces a voltage across the primary winding 24 that is in antiphase relative to the voltage across the secondary winding 26 generated by the power amplifier. The ratio of the amplitudes of the voltage across the secondary winding 26 and the voltage across the primary winding 24 is determined by a number of different factors, including the ratio of the number of coils included in the primary and secondary windings 26, the core used for the transformer 12, etc.

The induced voltage across the primary winding 24 of the transformer 12 is then fed to the antenna 3, 4 via the first terminal 28 of the primary winding 24, which then transmits the radio signal. The use of the transformer 12 in conjunction with the differential power amplifier 13 in this embodiment enables a greater power output at the antenna 3, 4 than e.g. through the use of a single ended power amplifier and no transformer, in part due to the improved impedance matching between the power amplifier 13 and the antenna 3, 4 enabled through the use of the transformer 12: the impedance of the primary winding 24 can be more closely matched to that of the antenna 3, 4, and the impedance of the secondary winding 26 can be more closely matched to that of the power amplifier 13, than if no transformer were included between the power amplifier 13 and the antenna 3, 4.

When the transceiver 1, 2 is operating in the reception mode, the centertap voltage $V_c$ is set to ground (i.e. the third terminal 35 of the secondary winding 26 is connected to ground). This means that negligible bias voltage is applied to the output terminals 36, 37 of the power amplifier 13, effectively disabling the power amplifier 13. This also means that the source terminal of the LNA transistor 18 is connected to ground through the proportion of the secondary winding 26 that lies between the first terminal 32 and the third terminal 35 thereof (i.e. one half of the secondary winding 26 in this particular embodiment). As the gate terminal of the LNA transistor 18 is connected, via the bias resistor 20, to the substantially constant bias voltage $V_b$, connecting the source terminal of the LNA transistor 18 in this manner increases the gate-source voltage across the LNA transistor 18 such that current may flow between the drain terminal and source terminal thereof, effectively enabling the LNA transistor 18.

When a radio signal is received at the antenna 3, 4, a voltage signal $V_{ant}$ is received at the first terminal 28 of the primary winding 24 of the transformer 12, thereby inducing an oscillating magnetic field in the primary winding 24. The oscillating magnetic field in the primary winding 24 then induces an antiphase oscillating magnetic field in the secondary winding 26. This in turn induces a voltage across the secondary winding 26 that is in antiphase relative to the voltage across the primary winding 24 generated by the voltage signal $V_{ant}$ received from the antenna 3, 4. The voltage at the source terminal of the LNA transistor 18 is therefore a voltage signal that oscillates around zero (due to the grounding of the third terminal 35 of the secondary winding) that is in antiphase relative to the voltage signal $V_{ant}$ received from the antenna 3, 4.

The voltage signal $V_{ant}$ received from the antenna 3, 4 is also received at the capacitor 22. The capacitor 22 filters out any DC components of the received signal $V_{ant}$, and transmits the remaining AC components to the gate terminal of the LNA transistor 18. The signal received at the gate terminal of the LNA transistor 18 is therefore a voltage signal that oscillates around the bias voltage $V_b$.

As the signals at the source and gate terminals of the LNA transistor 18 are in antiphase relative to each other, the voltage swing across the gate and source terminals of the LNA transistor 18 (i.e. the gate-source voltage swing of the LNA transistor) is increased in magnitude when compared to simply receiving the signal $V_{ant}$ at the gate terminal of the LNA transistor 18 and connecting the source terminal of the LNA transistor 18 to ground. As a result, the changes in the current $I_a$ drawn by the LNA transistor 18 are also increased in magnitude, thereby increasing the gain of the LNA transistor 18 and therefore of the low-noise amplifier circuit portion 11 as a whole.

The transformer 12 also enables improved impedance matching between the output of the low-noise amplifier portion 11 and the antenna 3, 4: the impedance of the primary winding 24 can be more closely matched to that of the antenna 3, 4, and the impedance of the secondary winding 26 can be more closely matched to that of the output of the low-noise amplifier circuit portion 11, than if no transformer were included in the circuit portion 10.

Similarly, the use of the transformer 12 in conjunction with the differential power amplifier 13 in this embodiment enables a greater power output at the antenna 3, 4 than e.g. through the use of a single ended power amplifier and no transformer, in part due to the improved impedance matching between the power amplifier 13 and the antenna 3, 4 enabled through the use of the transformer 12, as the impedance of the primary winding 24 can be more closely matched to that of the antenna 3, 4, and the impedance of the secondary winding 26 can be more closely matched to that of the power amplifier 13, than if the power amplifier 13 were connected directly to the antenna 3, 4.

In this embodiment, the LNA transistor 18 comprises a high-voltage metal-oxide-semiconductor field-effect-transistor (MOSFET) in order to be able to cope with the high voltage at the source terminal thereof when the transceiver 1, 2 is operating in the transmission mode, as well as the high voltage swing between the gate and source terminals thereof when the transceiver 1, 2 is operating in the reception mode. In this embodiment the LNA transistor 18 comprises a 2.5V MOSFET, though it will be appreciate that the LNA transistor 18 may equally comprise any other appropriate type of transistor.

When the centertap voltage $V_c$ is set to $V_{dd1}$, the circuit portion 10 is made suitable for transmitting radio signals, as a suitable bias voltage is then applied to the output terminals 36, 37 of the power amplifier. By contrast, the low gate-source voltage of the LNA transistor 18 effectively disables the low-noise amplifier circuit portion 11. However when the third terminal 35 of the secondary winding 26 is instead grounded, the circuit portion 10 is rendered suitable for receiving radio signals as the high gate-source voltage of the LNA transistor 18 effectively enables the low-noise amplifier circuit portion 11 and negligible bias voltage is supplied to the output terminals 36, 37 of the power amplifier 13. Thus, it will be appreciated that the circuit portion 10 is particularly suitable for half-duplex applications (e.g. where the transceiver 1, 2 is capable of both transmission and reception, but not simultaneously) as the circuit portion 10 has distinct transmission and reception modes determined by the centertap voltage $V_c$ applied to the third terminal 35 of the secondary winding 26.

FIG. 3 shows the circuit portion 10 in more detail. In addition to the components shown in FIG. 2, FIG. 3 also shows additional components in the low-noise amplifier circuit portion 11 including a biasing circuit portion 14, a voltage control circuit portion 15, and a load circuit portion 16. The biasing circuit portion 14 provides the bias voltage $V_b$ shown in FIG. 2 to the gate terminal of the LNA transistor 18 via the bias resistor 20. The voltage control circuit portion 15 is used to control the centertap voltage $V_c$ applied to the third terminal 35 of the secondary winding 26. The load circuit portion 16 provides a load from which the LNA transistor 18 draws the current $I_a$ and outputs a voltage signal $V_{out}$ which can be transmitted to further components of the transceiver 1, 2—e.g. a mixer (not shown).

The low-noise amplifier circuit portion 11 shown in FIG. 3, in addition to the components shown in FIG. 2, comprises a cascode transistor 38, an ESD protection module 40, and the biasing circuit portion 14. The biasing circuit portion 14 comprises the bias resistor 20 (also shown in FIG. 2), a mirror transistor 42 and a current source 44. The voltage control circuit portion 15 comprises a first voltage control transistor 46, a second voltage control transistor 48 and a capacitor 50. The first voltage control transistor 46 and the capacitor 50 are both connected to ground, and the second voltage control transistor 48 is connected to the first supply voltage $V_{dd1}$. The load circuit portion 16 comprises a resistor 52, an inductor 54 and a capacitor 56, each connected to a second supply/reference voltage $V_{dd2}$. The second supply voltage $V_{dd2}$ in this embodiment comprises another local supply voltage, connected to a global supply voltage via one or more switches or transistors, that is different from the first local supply voltage $V_{dd1}$. The second supply voltage $V_{dd2}$ may be equal to 1.3V, 3V, 5V, or any other appropriate voltage. The load circuit portion 16 also comprises a terminal for outputting an amplified voltage signal $V_{out}$ to one or more further components included in a receive chain of the transceiver 1, 2—e.g. a mixer (not shown). It will be appreciated that the resistor 52 may equally comprise a fixed resistor, or any other suitable type of resistor. It will also be appreciated that the resistor 52 may not comprise a physical resistor, but instead be a representation of the quality factor of the inductor 54 at resonance, as will be described in further detail herein.

In the low-noise amplifier circuit portion 11, the source terminal of the cascode transistor 38 is connected to the drain terminal of the LNA transistor 18. The drain terminal of the cascode transistor 38 is connected to the load circuit portion 16. The gate terminal of the cascode transistor 38 is connected to further control circuitry that is not shown in FIG. 3, as will be described in further detail below. The ESD protection module 40 is connected to the gate terminal of the LNA transistor 18, and to the bias resistor 20 of the biasing circuit portion 14. The ESD protection module 40 provides additional, secondary protection from ESD for the gate terminal of the LNA transistor 18 on top of the primary ESD protection included in the antennas 3, 4 in this particular embodiment. This further aids to prevent damage to the gate terminal of the LNA transistor occurring as a result of ESD. It will be appreciated that the ESD protection module 40 may comprise any appropriate arrangement of components that provide ESD protection without significantly attenuating the critical signal $V_{ant}$ received from the antenna 3, 4 via the capacitor 22 (although the ESD protection module 40 in this embodiment may attenuate the critical signal by a small amount).

The cascode transistor 38, together with the LNA transistor 18, form a cascode arrangement in the low-noise amplifier circuit portion 11. The cascode transistor 38 causes the drain voltage of the LNA transistor to remain substantially constant, and thus effectively isolates the LNA transistor 18 from the load circuit portion 18 (and therefore from the second supply voltage $V_{dd2}$). When the transceiver 1, 2 is operating in the reception mode, the control circuitry (not shown in FIG. 3) connected to the gate terminal of the cascode transistor 38 applies a substantially constant reference voltage to the gate terminal of the cascode transistor 38, thereby enabling current to flow from the drain terminal to the source terminal thereof. This enables the LNA transistor 18 to draw the current $I_a$ from the load circuit portion 16, through the cascode transistor 38, effectively enabling the LNA transistor 18.

When the transceiver 1, 2 is operating in the transmission mode, the control circuitry (not shown in FIG. 3) connected to the gate terminal of the cascode transistor 38 connects the gate terminal of the cascode transistor 38 to ground, thereby preventing current from flowing from the drain terminal to the source terminal thereof. This prevents the LNA transistor 18 from drawing the current $I_a$, thus preventing DC current flowing from the low-noise amplifier circuit portion 11 into the secondary winding 26 and effectively disabling the LNA transistor 18. This helps improves operation of the power amplifier 13 and the transformer 12 when the transceiver 1, 2 is operating in the transmission mode.

The inclusion of the cascode transistor 38, as well as isolating the LNA transistor 18 from the second supply voltage $V_{dd2}$, may help prevent a local oscillator (LO) component from a mixer (not shown) included in a receive chain of the transceiver 1, 2 from travelling back through the low-noise amplifier circuit portion 11 and eventually radiating from the antenna 3, 4. In other words, the cascode transistor 38 may improve reverse isolation for the LNA transistor 18, and thus the low-noise amplifier circuit portion 11 as a whole. Furthermore, the inclusion of the cascode transistor 38 may reduce the Miller effect for the LNA transistor 18 and thus reduce its input capacitance. Additionally, the inclusion of the cascode transistor 38 may increase the output impedance of the low-noise amplifier circuit portion 11, thus enabling improved impedance matching between the output thereof and further circuitry included in a receive chain of the transceiver 1, 2 (e.g. a mixer) and increasing the overall gain of the low-noise amplifier circuit portion 11.

In the biasing circuit portion 14, the current source 44 is connected to the drain terminal of the mirror transistor 42. The current source 44 may comprise any suitable selection of components arranged to provide a substantially constant output current, as is known in the art. The mirror transistor 42 is diode-connected—i.e. the gate and source terminals thereof are connected together. The gate terminal of the mirror transistor 42 is connected to the bias resistor 20, which is then connected to the ESD protection module 40. The source terminal of the mirror transistor 42 is connected to the source terminal of the LNA transistor 18, and therefore also connected to the first terminal 32 of the secondary winding 26. The connections of the biasing circuit portion 14—particularly the connection between the source nodes of the mirror transistor 42 and the LNA transistor 18 which causes both source nodes to be grounded to the same location (i.e. the third terminal 35 of the secondary winding 26) when the transceiver 1, 2 is operating in the reception mode—enable the biasing circuit portion 14 to provide the substantially constant bias voltage $V_b$ to the gate terminal of the LNA transistor 18 through the bias resistor 20 and the ESD protection cell 40.

In the voltage control circuit portion 15, the source terminal of the first voltage control transistor 46 is connected to ground. The drain terminal of the first voltage control transistor 46 is connected to the third terminal 35 of the secondary winding 26. The source terminal of the second voltage control transistor 48 is connected to the third terminal 35 of the secondary winding. The drain terminal of the second voltage control transistor is connected to the first supply voltage $V_{dd1}$. The gate terminals of the first and second voltage control transistors 46, 48 are connected to further control circuitry that is not shown in FIG. 3, as will be described in further detail below. The capacitor 50 is connected between ground and the third terminal 35 of the secondary winding 26, and therefore also to the drain terminal of the first voltage control transistor 46 and the source terminal of the second voltage control transistor 48.

When the transceiver 1, 2 is operating in the transmission mode, the further control circuitry (not shown) connected to the gate terminal of the first voltage control transistor 46 connects this gate terminal to ground, thereby preventing current from flowing between the drain terminal and the source terminal thereof. The further control circuitry (not shown) connected to the gate terminal of the second voltage control transistor 48 instead applies a substantially constant reference voltage to this gate terminal, thereby enabling current to flow from the drain terminal to the source terminal thereof. This effectively isolates the third terminal 35 of the secondary winding 26 from ground and connects it to the first supply voltage $V_{dd1}$, thus setting the centertap voltage $V_c$ equal to the first supply/reference voltage $V_{dd1}$.

When the transceiver 1, 2 is operating in the reception mode, the further control circuitry (not shown) connected to the gate terminal of the first voltage control transistor 46 applies a substantially constant reference voltage to this gate terminal, thereby enabling current to flow from the drain terminal to the source terminal thereof. The further control circuitry (not shown) connected to the gate terminal of the second voltage control transistor 48 instead connects this gate terminal to ground, thereby preventing current from flowing from the drain terminal to the source terminal thereof. This effectively isolates the third terminal 35 of the secondary winding from the first supply voltage $V_{dd1}$ and connects it to ground, thereby setting the centertap voltage $V_c$ equal to ground.

When the transceiver 1, 2 is operating in the transmission mode, the voltage control circuitry 15 (particularly the first and second voltage control transistors 46, 48) would usually apply a capacitive load to the outputs 36, 37 of the power amplifier 13. This is not the case in this particular embodiment, however. As the third terminal 35 of the secondary winding 26 is located at the midpoint between the first and second terminals 32, 34, it acts as a virtual ground between the two differential outputs of the power amplifier 13 (i.e. the centertap voltage $V_c$ remains constant due to the symmetry between the differential outputs 36, 37 of the differential power amplifier 13). The capacitive load of the voltage control circuit portion 15 is therefore of little or no concern when the transceiver 1, 2 is operating in the transmission mode, as no AC signals are received by the voltage control circuit portion 15 from the power amplifier 13. The capacitive load of the voltage control circuit portion 15 is also inconsequential when the transceiver 1, 2 is operating in the reception mode as the third terminal 35 of the secondary winding 26 is connected to ground. As a result, the two voltage control transistors 46, 48 in this embodiment comprises low-voltage MOSFETs—e.g. 1.3V MOSFETs—as the capacitive load of the voltage control circuit portion 15 (which may increase when low voltage MOSFETs are used) is of little or no concern. The use of low-voltage MOSFETs for the two voltage control transistors 46, 48 keeps the cost of manufacture and bill-of-materials low (as low-voltage MOSFETs are generally cheaper to manufacture/purchase than high-voltage MOSFETs). It will be appreciated, however, that in other embodiments the two voltage control transistors 46, 48 may each comprise any appropriate type of transistor.

In the load circuit portion 16, the resistor 52, the inductor 54 and the capacitor 56 are all connected in parallel between the second supply voltage $V_{dd2}$ and the terminal for outputting the amplified voltage signal $V_{out}$, which is then also connected to the drain terminal of the cascode transistor 38. When the transceiver 1, 2 is operating in the reception mode, the current $I_a$ is drawn by the LNA transistor 18 from the second supply voltage $V_{dd2}$ through three different current paths passing through the resistor 52, inductor 54 and capacitor 56 respectively. The varying current $I_a$, driven by the voltage signal received at the gate terminal of the LNA transistor 18, causes the voltage at the drain terminal of the cascode transistor 38 to vary proportionally to the drawn current $I_a$, with minimal additional noise. Thus, the voltage signal $V_{out}$ comprises an amplified version of the voltage signal received at the gate terminal of the LNA transistor 18 (i.e. the AC component of the voltage signal $V_{ant}$ received from the antenna 3, 4), with minimal additional noise being introduced by the low-noise amplifier circuit portion 11 and the load circuit portion 16. The voltage signal $V_{out}$ can then be transmitted to further components and/or circuitry of the transceiver 1, 2 (e.g. a mixer, not shown) in order to enable the transceiver 1, 2 to process a received radio signal.

The inclusion of the resistor 52, inductor 54 and capacitor 56 connected in parallel in the load circuit portion may help increase the output impedance of the low-noise amplifier circuit portion 11. Specifically, the inclusion of the inductor 54 in parallel with the capacitor 56 causes the load circuit portion 16 to resonate at frequencies close to that of a typical voltage signal $V_{ant}$ received from the antenna 3, 4. At resonance, the capacitor and inductor may not be 'visible' from the perspective of the low-noise amplifier circuit portion 11, and thus not affect the signal $V_{out}$ output by the low-noise amplifier circuit portion 11. Thus, the resistor 52 may determine the output impedance, and therefore the gain, of the low-noise amplifier circuit portion 11. In embodiments where the resistor 52 does not comprise a physical resistor, but instead is a representation of the quality factor of the inductor 54 at resonance, the output impedance (and gain) of the low-noise amplifier circuit portion 11 may be determined by the quality factor of the inductor 54 at resonance.

It will be appreciated by those skilled in the art that the invention has been illustrated by describing one or more specific embodiments thereof, but is not limited to these embodiments; many variations and modifications are possible within the scope of the appended claims.

The invention claimed is:

1. A circuit portion for a radio transceiver, wherein the transceiver is configured to operate in:
   a transmission mode in which the transceiver is capable of transmitting radio signals; and
   a reception mode in which the transceiver is capable of receiving radio signals;
wherein the circuit portion comprises:
   a power amplifier for use when the transceiver is operating in the transmission mode;
   a low-noise amplifier circuit portion for use when the transceiver is operating in the reception mode;
   a voltage control circuit portion; and
   a transformer comprising:
      a primary winding comprising a first terminal for connecting to an antenna; and
      a secondary winding comprising a first terminal, a second terminal and third terminal, the third terminal being located between the first and second terminals;
wherein:
   the power amplifier is connected to the secondary winding;
   the low-noise amplifier circuit portion is connected to both the primary winding and to the secondary winding; and
   the voltage control circuit portion is connected to the third terminal of the secondary winding, the voltage control circuit portion being arranged to:
      apply a first voltage to the third terminal of the secondary winding when the transceiver is operating in the transmission mode; and
      apply a second voltage to the third terminal of the secondary winding when the transceiver is operating in the reception mode, the second voltage being different from the first voltage.

2. The circuit portion as claimed in claim 1, wherein:
   the first voltage provides a bias voltage to the power amplifier, and increases a voltage at a connection between the low-noise amplifier circuit portion and the secondary winding such that negligible current flows from the low-noise amplifier circuit portion to the secondary winding; and
   the second voltage provides negligible bias voltage to the power amplifier, and decreases the voltage at the connection between the low-noise amplifier circuit portion and the secondary winding such that current may flow from the low-noise amplifier circuit portion to the secondary winding.

3. The circuit portion as claimed in claim 1, wherein the low-noise amplifier circuit portion comprises a low-noise amplifier transistor having a gate terminal connected to the first terminal of the primary winding and a source terminal connected to the first terminal of the secondary winding.

4. The circuit portion as claimed in claim 3, arranged such that when a first signal is received at the gate terminal of the low-noise amplifier transistor, a second signal is received at the source terminal of the low-noise amplifier transistor that is in antiphase relative to the first signal.

5. The circuit portion as claimed in claim 3, wherein the low-noise amplifier circuit portion further comprises a capacitor connected in series between the first terminal of the primary winding and the gate terminal of the low-noise amplifier transistor.

6. The circuit portion as claimed in claim 3, wherein the low-noise amplifier circuit portion further comprises an electrostatic discharge protection module connected in series between the first terminal of the primary winding and the gate terminal of the low-noise amplifier transistor.

7. The circuit portion as claimed in claim 3, wherein the low-noise amplifier circuit portion further comprises a biasing circuit portion comprising a diode-connected mirror transistor and a resistor, wherein:
a gate terminal of the mirror transistor is connected to the gate terminal of the low-noise amplifier transistor;
a source terminal of the mirror transistor is connected to the source terminal of the low-noise amplifier transistor; and
the resistor is connected in series between the gate terminal of the mirror transistor and the gate terminal of the low-noise amplifier transistor.

8. The circuit portion as claimed in claim 7, wherein the biasing circuit portion is arranged to provide a bias voltage to the gate terminal of the low-noise amplifier transistor.

9. The circuit portion as claimed in claim 3, wherein the low-noise amplifier circuit portion further comprises:
a cascode transistor; and
a load circuit portion comprising an inductor and a capacitor connected in parallel;
wherein:
a source terminal of the cascode transistor is connected to a drain terminal of the low-noise amplifier transistor; and
a drain terminal of the cascode transistor is connected to the load circuit portion.

10. The circuit portion as claimed in claim 3, wherein:
the first voltage reduces a gate-source voltage of the low-noise amplifier transistor such that negligible current flows between a or the drain terminal and the source terminal thereof; and
the second voltage increases the gate-source voltage of the low-noise amplifier transistor such that current may flow between the drain terminal and the source terminal thereof.

11. The circuit portion as claimed in claim 1, wherein:
the power amplifier is a differential power amplifier comprising a first output and a second output;
the first terminal of the secondary winding is connected to the first output terminal of the power amplifier; and
the second terminal of the secondary winding is connected to the second output terminal of the power amplifier.

12. The circuit portion as claimed in claim 1, wherein the third terminal of the secondary winding is located at a midpoint between the first and second terminals of the secondary winding.

13. The circuit portion as claimed in claim 1, wherein the third terminal of the secondary winding is arranged to act as a virtual ground when the transceiver is operating in the transmission mode.

14. The circuit portion as claimed in claim 1, wherein the voltage control circuit portion is arranged to:
apply a reference voltage to the third terminal of the secondary winding when the transceiver is operating in the transmission mode; and
connect the third terminal of the secondary winding to ground when the transceiver is operating in the reception mode.

15. The circuit portion as claimed in claim 1, wherein the primary winding comprises a second terminal that is connected to ground.

16. The circuit portion as claimed in claim 1, wherein the low-noise amplifier circuit portion comprises a single-ended low-noise amplifier.

17. The circuit portion as claimed in claim 1, wherein:
the voltage control circuit portion comprises a first voltage control transistor;
a drain terminal of the first voltage control transistor is connected to the third terminal of the secondary winding; and
a source terminal of the first voltage control transistor is connected to ground.

18. The circuit portion as claimed in claim 17, wherein:
the voltage control circuit portion comprises a second voltage control transistor;
a drain terminal of the second voltage control transistor is connected to a positive supply voltage; and
a source terminal of the second voltage control transistor is connected to the third terminal of the secondary winding.

19. The circuit portion as claimed in claim 1, wherein the circuit portion is a radio-frequency front-end circuit portion.

20. A method of operating a radio transceiver, the transceiver comprising:
a power amplifier;
a low-noise amplifier circuit portion;
a voltage control circuit portion; and
a transformer comprising:
a primary winding comprising a first terminal for connecting to an antenna; and
a secondary winding comprising a first terminal, a second terminal and third terminal, the third terminal being located between the first and second terminals;
wherein:
the power amplifier is connected to the secondary winding;
the low-noise amplifier circuit portion is connected to both the primary winding and to the secondary winding; and
the voltage control circuit portion is connected to the third terminal of the secondary winding;
the method comprising:
transmitting one or more radio signals while operating the transceiver in a transmission mode;
receiving one or more radio signals while operating the transceiver in a reception mode;

applying a first voltage to the third terminal of the secondary winding using the voltage control circuit portion when the transceiver is operating in the transmission mode; and applying a second voltage to the third terminal of the secondary winding using the voltage control circuit portion when the transceiver is operating in the reception mode, the second voltage being different from the first voltage.

\* \* \* \* \*